(12) United States Patent
Lau et al.

(10) Patent No.: US 6,441,688 B1
(45) Date of Patent: Aug. 27, 2002

(54) SINGLE-TO-DIFFERENTIAL BUFFER AMPLIFIER

(75) Inventors: Sin Kai Henry Lau, Scottsdale; Glenn Watanabe, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 70 days.

(21) Appl. No.: 09/641,990

(22) Filed: Aug. 18, 2000

(51) Int. Cl.[7] ................................................ H03F 3/45
(52) U.S. Cl. ...................................... 330/301; 330/257
(58) Field of Search ................................. 330/252, 257, 330/288, 300, 301

(56) References Cited

U.S. PATENT DOCUMENTS

| | | | | |
|---|---|---|---|---|
| 4,885,550 A | * | 12/1989 | Ferrer | .......................... 330/301 |
| 5,497,123 A | | 3/1996 | Main et al. | ................... 330/257 |
| 5,767,662 A | * | 6/1998 | Perkins | ......................... 330/301 |
| 5,945,878 A | * | 8/1999 | Westwick et al. | ............ 330/301 |

* cited by examiner

*Primary Examiner*—Steven J. Mottola
(74) *Attorney, Agent, or Firm*—Charles W. Bathards; Mark J. Fink

(57) ABSTRACT

A radio frequency single to differential buffer amplifier provides a 180 degree phase difference between two output signals by using a current mirroring circuit and using different referencing on the two output signals. Fine adjustment on the phase of the two output signals can be done by adjusting a phase adjustment device embedded in a cascode amplifier. High input power handling capability is accomplished by class AB operation on two input transistors in the amplifier.

17 Claims, 2 Drawing Sheets

—PRIOR ART—

—PRIOR ART—

—PRIOR ART—

SINGLE-TO-DIFFERENTIAL BUFFER AMPLIFIER

FIELD OF THE INVENTION

This invention relates to amplifiers and, more specifically, to a radio frequency single-to-differential buffer amplifier which generates differential outputs having the same amplitude but 180 degrees out of phase.

BACKGROUND OF THE INVENTION

One prior art single to differential amplifier is shown in FIG. 1. The differential amplifier shown in FIG. 1 will take a single ended radio frequency and convert it into a differential output. The amplifier in FIG. 1 works at low frequencies. However, at high frequencies, parasitic capacitances cause amplitude and phase mismatch.

Another prior art single to differential amplifier is shown in FIG. 2. The amplifier is driven by a single ended source. The signal is converted to a differential output by using a transformer. The problem with this differential amplifier is that it requires a transformer which when placed on-chip consumes significant amounts of valuable die area.

FIG. 3 shows another prior art single to differential amplifier. The differential amplifier depicted in FIG. 3 has some of the same problems as the previous prior art differential amplifiers. At high frequencies and high input power, the two output signals are no longer balanced. The two output signals will have phase and amplitude mismatch problems.

The prior art differential amplifiers have problems associated with operating at high frequencies and high power. This creates a need to provide a new single to differential buffer amplifier that can operate over a wide range of frequencies and power levels. The new single to differential buffer amplifier must be cost efficient and take up minimal amounts of die area.

DETAILED DESCRIPTION OF THE PREFERRED EMBODIMENT

Figure 1:
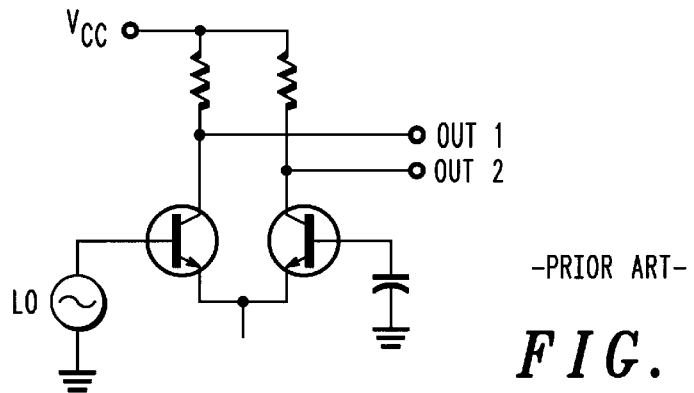
FIG. 1 is a simplified electrical schematic of a prior art single to differential amplifier.
Figure 2:
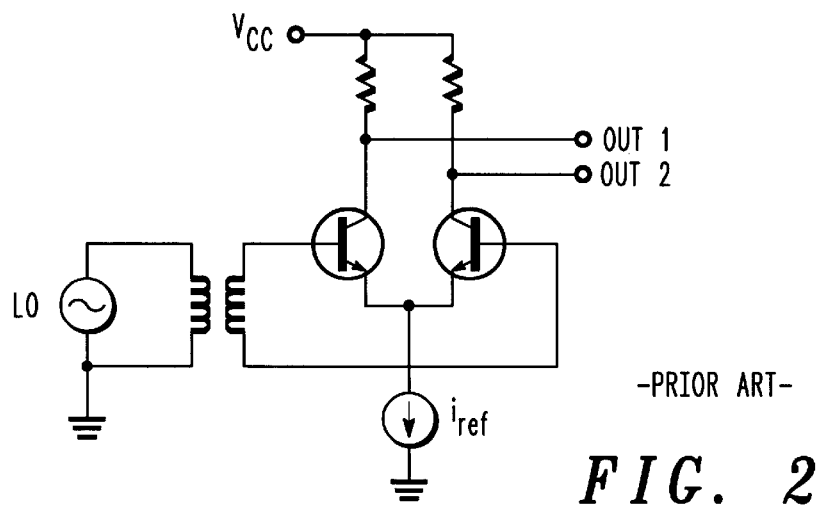
FIG. 2 is a simplified electrical schematic of another prior art single to differential amplifier.
Figure 3:
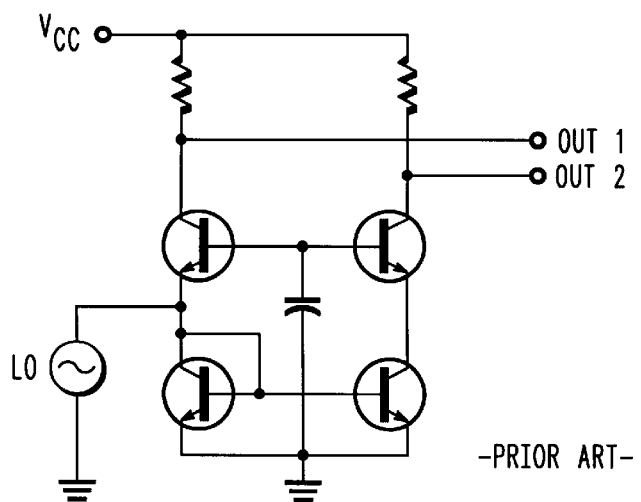
FIG. 3 is a simplified electrical schematic of another prior art single to differential amplifier.
Figure 4:
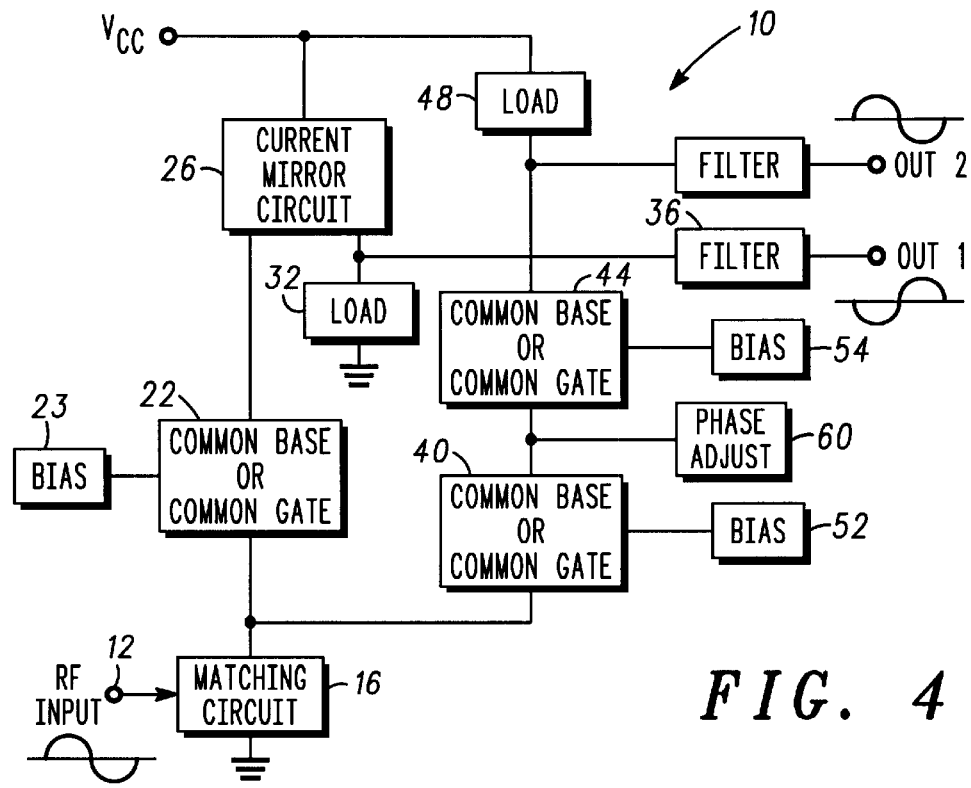
FIG. 4 is a simplified functional block diagram of one embodiment of the single to differential buffer amplifier in accordance with the present invention.
Figure 5:
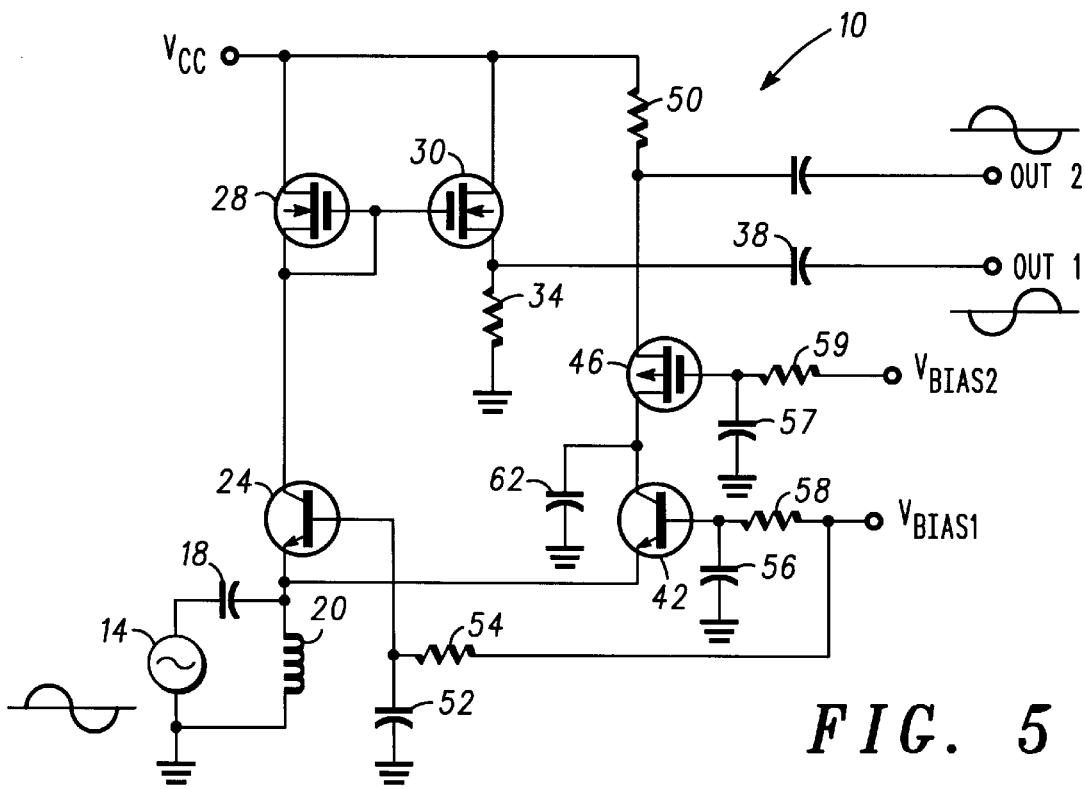
FIG. 5 is a simplified electrical schematic of one embodiment of the single to differential buffer amplifier depicted in FIG. 4.

Referring to FIGS. 4–5, one embodiment of the single to differential buffer amplifier 10 (hereinafter amplifier 10) is shown. The amplifier 10 has a radio frequency input signal 12. As may be seen in FIG. 5, the input signal 12 may be from a local oscillator 14. However, any type of single ended radio frequency input signal will work with the amplifier 10. The input signal 12 is passed to a matching circuit 16. The matching circuit 16 ensures that the signal coming out of the matching circuit 16 is not degraded. Thus, the signal coming out of the matching circuit 16 will have the same amplitude and phase as the radio frequency input signal 12. In the embodiment depicted in FIG. 5, the matching circuit 16 has a capacitive element 18 which has a first terminal connected to the local oscillator 14. A second terminal of the capacitive element 18 is connected to a first terminal of an inductive element 20. A second terminal of the inductive element 20 is connected to ground.

The signal coming out of the matching circuit 16 is sent to two separate branches. The signal in the first branch will be sent to a transistor 22 which is connected to the matching circuit 16 and to a bias source 23. The transistor 22 is used to ensure that the signal in the first branch will have the same signal bandwidth (i.e., same amplitude and phase) as the radio frequency input signal.

The transistor 22 can be set-up in a common base or common gate configuration. The embodiment depicted in FIG. 5 shows a bipolar transistor 24 in a common base configuration. However, a field effect transistor in a common gate configuration could be used. In FIG. 5, the bipolar transistor 24 has a first, second, and third terminals. The first or emitter terminal is connected to the first terminal of the inductive element 20. The second or base terminal is connected to a bias source 23. The third or collector terminal is connected to a current mirror circuit 26.

The bias circuit 23 is used to control when the transistor 22 is active. One embodiment of the bias circuit 23 is shown in FIG. 5. In FIG. 5, the bias circuit 23 has a capacitive element 52 connected to a resistive element 54. As can be seen in FIG. 5, the capacitive element 52 will have a first terminal connected to a first terminal of the resistive element 54 and a second terminal connected to ground. The resistive element 54 will have the first terminal connected to the capacitive element 52 and the base terminal of transistor 24 and a second terminal connected to a voltage source Vbias1.

The signal coming out of the transistor 22 is then coupled to the current mirror circuit 26. The current mirror circuit 26 mirrors the signal. The current mirror circuit 26 takes the signal and supplies or generates a complementary signal having the same amplitude and phase. In the embodiment shown in FIG. 5, the current mirror circuit 26 is comprised of a first transistor 28 and a second transistor 30. Each transistor 28 and 30 has a first or drain, second or gate and third or source terminals. The first or drain terminal of transistor 28 is connected to the second or gate terminal of the transistor 28. The third or source terminal of the transistor 28 is connected to the third or source terminal of transistor 30 and both are connected to the supply voltage Vcc. The second or gate terminal of transistor 30 is connected to the second or gate terminal of transistor 28.

The complementary signal of the current mirror circuit 26 is coupled through a load element 32 which is connected from the current mirror 26 to ground. The output signal OUT1 will be povided at the connection between the current mirror circuit 26 and load element 32. As can be seen in FIG. 5, the load element 32 may be a resistor 34 having a first terminal connected to the first or source terminal of the transistor 30 and a second terminal connected to ground.

The output signal 1 may run through a filter 36. The filter 36 is used to prevent corruption of the output signal 1. The filter 36 prevents corruption by blocking any external DC signals. In the embodiment depicted in FIG. 5, the filter 36 is a capacitive element 38.

In operation, when the radio frequency signal 12 goes up or increases, the signal from the transistor 22 increases and the complimentary signal or voltage coming out of the current mirror 26 goes down (at the source of transistor 30 in FIG. 5). Since the complimentary signal coming out of the current mirror 26 goes down, the signal or current flowing through the load goes down which causes the voltage across the load 32 to go down. Thus, the output signal 1 will be 180 degrees out of phase with the radio frequency input signal 12.

The signal in the second branch is sent through a first transistor 40. The signal will pass through the transistor 40 with no signal degradation (i.e., same amplitude and phase). The signal out of the transistor 40 is then passed through a second transistor 44. The signal will pass through the second transistor 44 with no signal degradation (i.e., same amplitude and phase). Both transistors 40 and 42 can be set-up in a common base or common gate configuration. However, the set-up of the transistor 40 will depend on the set-up of the transistor 22. In the embodiment depicted in FIG. 5, since the transistor 22 is set-up in a common base configuration 24, the transistor 40 is set-up in a common base configuration 42.

In the embodiment depicted in FIG. 5, the transistor 40 (FIG. 4) is a bipolar transistor 42 and the transistor 44 (FIG. 4) is a field effect transistor 46. Both the bipolar transistor 42 and field effect transistor 46 have a first, second, and third terminals. The first or emitter terminal of the bipolar transistor 42 is connected to the first terminal of the inductive element 20 of the matching circuit 16. The second or base terminal of the bipolar transistor 42 is connected to a bias source 52. The third or collector terminal of transistor 42 is connected to the first or source terminal of the field effect transistor 46. The second or gate terminal of the field effect transistor 46 is connected to a bias source 54. The third or drain terminal of the field effect transistor 46 is connected to a load element 48.

The bias source 52 and 54 are used to control when the transistors 40 and 44 are active. Both bias source 52 and 54 may take the form as shown in FIG. 5. Each bias source 52 and 54 may have a capacitive element 56 and 57 respectively. Connected to each capacitive element 56 and 57 is a resistive element 58 and 59 respectively. As can be seen in FIG. 5, the capacitive element 56 will have a first terminal connected to a first terminal of the resistive element 58 and a second terminal connected to ground.. The resistive element 58 will have the first terminal connected to the capacitive element 56 and a second terminal connected to a voltage source Vbias1. The capacitive element 57 will have a first terminal connected to a first terminal of the resistive element 59 and a second terminal connected to ground. The resistive element 59 will have the first terminal connected to the capacitive element 57 and a second terminal connected to a voltage source Vbias2.

The load element 48 is connected to the transistor 44 and to a voltage supply Vcc. The signal from the transistor 44 is coupled to the load element 48. The output signal OUT2 is provided at the connection between the load 48 and transistor 44. As can be seen in FIG. 5, the load element 48 may be a resistor 50 having a first or drain terminal connected to the first terminal of the transistor 46 and a second terminal connected to Vcc.

In operation, as the radio frequency input signal 12 goes positive, the signal out of transistors 40 and 44 go positive. Since the load 48 is referenced to Vcc, as the signal goes up, the voltage across the load 48 decreases the voltage at OUT2 (relative to ground)increases. Thus, the output signal 2 will be in phase with the radio frequency input signal 12.

The output signal 1 and output signal 2 may not be perfectly 180 degrees out of phase due to component mismatch. Furthermore, at higher frequencies, parasitics may slightly alter the output signals. For this reason, a phase adjust device 60 is connected between the transistor 40 and the transistor 44 of the second current path. The phase adjust device 60 is used to adjust the phase of the output signal 2 so that the output signal 1 and output signal 2 will be 180 degrees out of phase. The phase adjust device 60 is connected between the transistor 40 and the transistor 44 of the second current path to provide isolation between the radio frequency input signal 12 and the output signal 2 so that the phase characteristics of the amplifier 10 is independent of the load. In the embodiment shown in FIG. 5, the phase adjust device 60 is a capacitive element 62. The capacitive element 62 will have a first and second terminal. The first terminal of the capacitive element is connected to the third or collector terminal of the bipolar transistor 42. The second terminal of the capacitive element 62 is connected to ground.

In the embodiment shown in FIG. 5, the bipolar transistors 24 and 42 are setup in a common base configuration. The common base configuration allows the transistors 24 and 42 to operate in a Class AB operation. This means that the DC biasing point of the transistors 24 and 42 will change according to the input power level. The higher the input power level, the more current the transistors 24 and 42 will draw due to the dynamic adjustment in the emitter voltage. With this kind of dynamic adjustment, the transistors 24 and 42 can handle higher input power than just a fixed base-emitter voltage biasing condition. This allows the amplifier 10 to obtain amplitude and phase match over a wide input power range.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A radio frequency single to differential buffer amplifier comprising:
   a radio frequency input signal;
   a matching circuit coupled to the radio frequency input signal which preserves the radio frequency input signal;
   an output circuit which provides a first output signal and a second output signal wherein the first and second output signals have approximately a same amplitude and are approximately 180 degrees out of phase over a high frequency range of operation and is independent of the input power, wherein the output circuit comprises a first current path which provides the first output signal; and a second current path which provides the second output signal, and wherein the first current path comprises:
   a transistor coupled to the matching circuit for preserving the radio frequency input signal;
   a current mirror coupled to the transistor of the first current path which supplies a complementary signal having similar characteristics as the radio frequency input signal; and
   a load device coupled to the current mirror and to ground which develops the first output signal.

2. A radio frequency single to differential buffer amplifier in accordance with claim 1 further comprising a filtering device coupled to the load device of the first current path which prevents corruption of the first output signal.

3. A radio frequency single to differential buffer amplifier in accordance with claim 2 wherein the filtering device is a capacitive element.

4. A radio frequency single to differential buffer amplifier in accordance with claim 1 wherein the transistor of the first current path is a transistor in a common base configuration.

5. A radio frequency single to differential buffer amplifier in accordance with claim 1 wherein the transistor of the first current path is a transistor in a common gate configuration.

6. A radio frequency single to differential buffer amplifier in accordance with claim 1 further comprising a bias circuit coupled to the transistor of the first current path.

7. A radio frequency single to differential buffer amplifier in accordance with claim 1 wherein the first current path current mirror comprises:

a first current mirror transistor having a first, second, and third terminals wherein the first terminal of the first current mirror transistor is coupled to the second terminal of the first current mirror transistor; and a second current mirror transistor having a first, second, and third terminals wherein the first terminal of the second current mirror transistor is coupled to the load device of the first current path, the second terminal of the second current mirror transistor is coupled to the second terminal of the first current mirror transistor, and the third terminal of the second current mirror transistor is coupled to the third terminal of the first current mirror transistor.

8. A radio frequency single to differential buffer amplifier in accordance with claim 1 wherein the load device of the first current path is a resistive element.

9. A radio frequency single to differential buffer amplifier comprising:

a radio frequency input signal;

a matching circuit coupled to the radio frequency input signal which preserves the radio frequency input signal;

an output circuit which provides a first output signal and a second output signal wherein the first and second output signals have approximately a same amplitude and are approximately 180 degrees out of phase over a high frequency range of operation and is independent of the input power, wherein the output circuit comprises a first current path which provides the first output signal; and a second current path which provides the second output signal, and wherein the second current path comprises:

a first transistor coupled to the matching circuit for preserving the radio frequency input signal;

a second transistor coupled to the first transistor for preserving the radio frequency input signal;

a load device coupled to the second transistor of the second current path and to a bias voltage which develops the second output signal; and a phase adjustment device coupled to the first transistor and the second transistor of the second current path for adjusting a phase of the second output signal.

10. A radio frequency single to differential buffer amplifier in accordance with claim 9 wherein the first transistor of the second current path is a transistor in a common base configuration.

11. A radio frequency single to differential buffer amplifier in accordance with claim 10 wherein the second transistor of the second current path is a transistor in a common gate configuration.

12. A radio frequency single to differential buffer amplifier in accordance with claim 9 wherein the first transistor of the second current path is a transistor in a common gate configuration.

13. A radio frequency single to differential buffer amplifier in accordance with claim 12 wherein the second transistor of the second current path is a transistor in a common base configuration.

14. A radio frequency single to differential buffer amplifier in accordance with claim 9 wherein the load device is a resistive element.

15. A radio frequency single to differential buffer amplifier in accordance with claim 9 further comprising a filtering device coupled to the load device of the second current path which prevents corruption of the first output signal.

16. A radio frequency single to differential buffer amplifier in accordance with claim 9 further comprising a biasing circuit coupled to the first transistor of the second current path.

17. A radio frequency single to differential buffer amplifier in accordance with claim 9 further comprising a biasing circuit coupled to the second transistor of the second current path.

\* \* \* \* \*